US007425402B2

(12) United States Patent
Loccufier et al.

(10) Patent No.: US 7,425,402 B2
(45) Date of Patent: Sep. 16, 2008

(54) HEAT-SENSITIVE LITHOGRAPHIC PRINTING PLATE PRECURSOR

(75) Inventors: Johan Loccufier, Zwijnaarde (BE); Bert Groenendaal, Sinaai (BE); Marc Van Damme, Mechelen (BE); Huub Van Aert, Pulderbos (BE)

(73) Assignee: Agfa Graphics, N.V., Morstel (BE)

( * ) Notice: Subject to any disclaimer, the term of this patent is extended or adjusted under 35 U.S.C. 154(b) by 98 days.

(21) Appl. No.: 10/916,154

(22) Filed: Aug. 11, 2004

(65) Prior Publication Data

US 2005/0037280 A1 Feb. 17, 2005

Related U.S. Application Data

(60) Provisional application No. 60/499,428, filed on Sep. 2, 2003.

(30) Foreign Application Priority Data

Aug. 13, 2003 (EP) .................................. 03102522

(51) Int. Cl.
*G03C 1/77* (2006.01)
*G03F 7/09* (2006.01)
*G03F 7/038* (2006.01)
*G03F 7/039* (2006.01)

(52) U.S. Cl. ................. 430/271.1; 430/278.1; 430/302; 430/303; 430/325; 430/326; 430/944

(58) Field of Classification Search .............. 430/211.1, 430/905
See application file for complete search history.

(56) References Cited

U.S. PATENT DOCUMENTS

| | | | |
|---|---|---|---|
| 4,939,229 | A | 7/1990 | Bogan, Jr. |
| 5,641,608 | A | 6/1997 | Grunwald et al. |
| 6,063,544 | A | 5/2000 | Sheriff et al. |
| 6,090,905 | A | 7/2000 | Juzukonis et al. |

FOREIGN PATENT DOCUMENTS

| | | | |
|---|---|---|---|
| EP | 0 823 327 | A2 | 2/1998 |
| EP | 0 934 822 | A1 | 8/1999 |
| EP | 0 982 123 | A2 | 3/2000 |
| EP | 1 072 432 | A2 | 1/2001 |
| EP | 1 162 063 | A2 | 12/2001 |
| EP | 1 297 950 | A2 | 4/2003 |
| GB | 1 346 594 | | 2/1974 |
| WO | WO 95/28449 | | 10/1995 |
| WO | WO 99/01795 | | 1/1999 |
| WO | WO 2004/020484 | A1 | 3/2004 |

*Primary Examiner*—Sin J. Lee
(74) *Attorney, Agent, or Firm*—Leydig, Voit & Mayer, Ltd.

(57) ABSTRACT

A heat-sensitive lithographic printing plate precursor is disclosed which comprises a hydrophilic support and an oleophilic coating comprising an infrared absorbing agent and a developer soluble polymer which comprises a phenolic monomeric unit wherein the phenyl group of the phenolic monomeric unit is substituted by a group Q, wherein Q has the structure

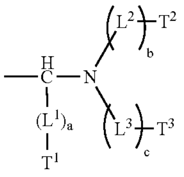

and is covalently linked to a carbon atom of the phenyl group and wherein $L^1$, $L^2$ and $L^3$ are linking groups, a, b and c are 0 or 1, and $T^1$, $T^2$ and $T^3$ are terminal groups. The polymer, substituted by the group Q, increases the chemical resistance of the coating.

10 Claims, No Drawings

HEAT-SENSITIVE LITHOGRAPHIC PRINTING PLATE PRECURSOR

CROSS-REFERENCE TO RELATED PATENT APPLICATIONS

This application claims the benefit of U.S. Provisional Application No. 60/499,428 filed Sep. 2, 2003, which is incorporated by reference. In addition, this application claims the benefit of European Application No. 03102522.4 filed Aug. 13, 2003, which is also incorporated by reference.

FIELD OF THE INVENTION

The present invention relates to a heat-sensitive lithographic printing plate precursor.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

A typical printing plate precursor for computer-to-film methods comprise a hydrophilic support and an image-recording layer of a photosensitive polymer which include UV-sensitive diazo compounds, dichromate-sensitized hydrophilic colloids and a large variety of synthetic photopolymers. Particularly diazo-sensitized systems are widely used. Upon image-wise exposure, typically by means of a film mask in a UV contact frame, the exposed image areas become insoluble and the unexposed areas remain soluble in an aqueous alkaline developer. The plate is then processed with the developer to remove the diazonium salt or diazo resin in the unexposed areas. So the exposed areas define the image areas (printing areas) of the printing master, and such printing plate precursors are therefore called 'negative-working'. Also positive-working materials, wherein the exposed areas define the non-printing areas, are known, e.g. plates having a novolac/naphtoquinone-diazide coating which dissolves in the developer only at exposed areas.

In addition to the above photosensitive materials, also heat-sensitive printing plate precursors have become very popular. Such thermal materials offer the advantage of daylight-stability and are especially used in the so-called computer-to-plate method wherein the plate precursor is directly exposed, i.e. without the use of a film mask. The material is exposed to heat or to infrared light and the generated heat triggers a (physico-)chemical process, such as ablation, polymerization, insolubilisation by cross-linking of a polymer, heat-induced solubilisation, decomposition, or particle coagulation of a thermoplastic polymer latex.

The known heat-sensitive printing plate precursors typically comprise a hydrophilic support and a coating containing an oleophilic polymer, which is alkali-soluble in exposed areas (positive working material) or in non-exposed areas (negative working material) and an IR-absorbing compound. Such an oleophilic polymer is typically a phenolic resin.

EP-A 0 934 822 describes a photosensitive composition for a lithographic printing plate wherein the composition contains an alkali-soluble resin having phenolic hydroxyl groups and of which at least some of the phenolic hydroxyl groups are esterified by a sulphonic acid or a carboxylic acid compound.

EP-A 1 072 432 describes an image forming material which comprises a recording layer which is formed of a composition whose solubility in water or in an alkali aqueous solution is altered by the effects of light or heat. This recording layer comprises a polymer of vinyl phenol or a phenolic polymer, wherein hydroxy groups and alkoxy groups are directly linked to the aromatic hydrocarbon ring. The alkoxy group is composed of 20 or less carbon atoms.

U.S. Pat. No. 5,641,608 describes a direct process for producing an imaged pattern on a substrate surface for printed circuit board application. The process utilises a thermo-resist composition which undergo a thermally-induced chemical transformation effective either to ablate the composition or to increase or decrease its solubility in a particular developer. The thermo-resist composition comprises phenolic polymers in which free hydroxyl groups are protected. Upon heating in the presence of an acid these protecting groups split off resulting in a solubility change of the composition. In positive thermo-resists the hydroxyl protecting groups may be ethers, such as alkyl-, benzyl-, cycloalkyl- or trialkylsilyl-ethers, and oxy-carbonyl groups.

EP-A 0 982 123 describes a photosensitive resin composition or recording material wherein the binder is a phenolic polymer, substituted with a specific functional group on the aromatic hydrocarbon ring such as a halogen atom, an alkyl group having 12 or less carbon atoms, an alkoxy group, an alkylthio group, a cyano group, a nitro group or a trifluoromethyl group, or wherein the hydrogen atom of the hydroxy group of the phenolic polymer is substituted with a specific functional group such as an amide, a thioamide or a sulphonamide group. As a result, the coating of the recording material has such a high density that improves the intra-film transistivity of heat obtained by the light-to-heat conversion at the time of laser exposure. The high density of the coating makes the image recording material less susceptible to external influences such as humidity and temperature. Consequently, the storage stability of the image recording material can also be enhanced.

U.S. Pat. No. 4,939,229 describes a method for the preparation of branched novolacs, useful for photoresist compositions, by reacting a tris- or tetrakis(dialkylaminoalkyl)phenol with a phenolic compound in the presence of an acid catalyst. Due to the reaction with these intermediate dialkylaminoalkyl-phenol compounds, a reproducible method for the synthesis of branched novolacs is obtained.

WO99/01795 describes a method for preparing a positive working resist pattern on a substrate wherein the coating composition comprises a polymeric substance having functional groups such that the functionalised polymeric substance has the property that it is developer insoluble prior to delivery of radiation and developer soluble thereafter. Suitable functional groups are known to favor hydrogen bonding and may comprise amino, amido, chloro, fluoro, carbonyl, sulphinyl and sulphonyl groups and these groups are bonded to the polymeric substance by an esterification reaction with the phenolic hydroxy group to form a resin ester.

The ink and fountain solution which are supplied to the plate during the printing process, may attack the coating and, consequently, the resistance of the coating against these liquids, hereinafter referred to as "chemical resistance", may affect the printing run length. The most widely used polymers in these coatings are phenolic resins and it has been found in the above prior art that the printing run length can be improved by modifying such resins by a chemical substitution reaction. However, this modification reaction reduces its solubility in such a way they become insoluble in an alkaline developer. The polymers modified by the chemical reaction proposed in the present invention enable to increase the chemical resistance of the coating without being insoluble in an alkaline developer.

EP-A 1 297 950 describes a heat-sensitive lithographic printing plate precursor comprising a polymer which is soluble in an aqueous alkaline solution and which comprises at least one chromophoric moiety having a light absorption maximum in the wavelength range between 400 and 780 nm. The polymer represented by the following structure

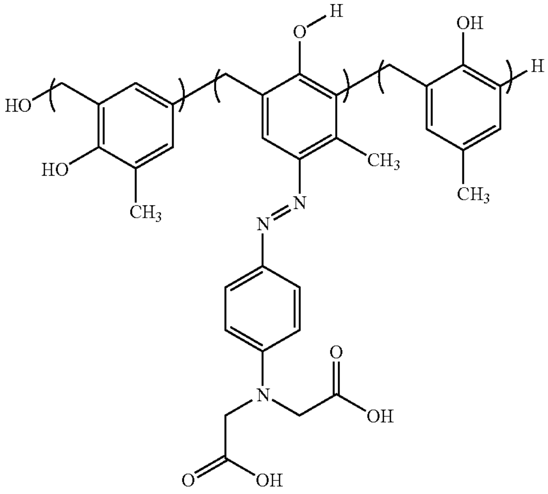

is mentioned in this document, but this polymer and the other polymers disclosed in this document are specially selected to solve the problem of "dye stain", due to an incomplete removal, during processing with an aqueous alkaline developer." In this document nothing is mentioned about the use of these polymers to increase the chemical resistance of the coating against printing liquids and press chemicals.

SUMMARY OF THE INVENTION

It is an aspect of the present invention to provide a heat-sensitive lithographic printing plate precursor comprising a heat-sensitive coating with improved chemical resistance of the coating against printing liquids and press chemicals. This object is realized by the precursor as defined in claim 1, having the characteristic feature that the heat-sensitive coating of the precursor comprises a developer soluble polymer which comprises a phenolic monomeric unit wherein the phenyl group of the phenolic monomeric unit is substituted by a group Q. The group Q has the structure of formula 1

(formula 1)

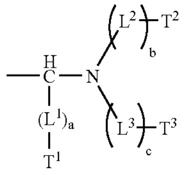

and is covalently linked to a carbon atom of the phenyl group and wherein $L^1$, $L^2$ and $L^3$ represent each a linking group, wherein a, b and c are each independently 0 or 1, and wherein $T^1$, $T^2$ and $T^3$ represent each a terminal group. The polymer represented by the following structure

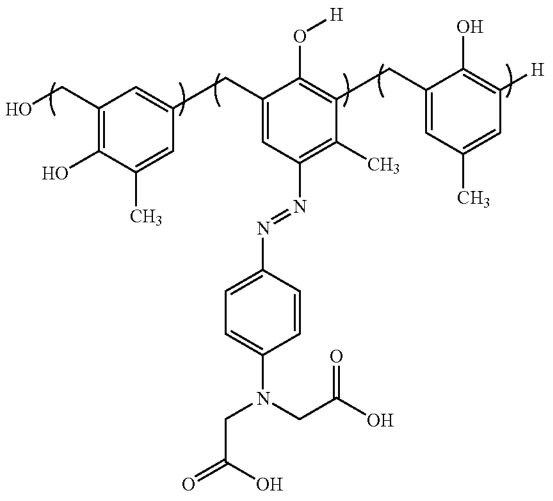

is excluded of the present invention.

Specific embodiments of the invention are defined in the dependent claims.

DETAILED DESCRIPTION OF THE INVENTION

In order to obtain a heat-sensitive lithographic printing plate with an improved printing run length, it is important to increase the chemical resistance of the heat-sensitive coating against the printing liquids such as the dampening liquid and ink, and against the press chemicals such as cleaning liquids for the plate, for the blanket and for the press rollers. These printing properties are affected by the composition of the coating wherein the type of polymer is one of the most important components for this property.

In accordance with the present invention, there is provided a heat-sensitive lithographic printing plate precursor comprising a support having a hydrophilic surface and an oleophilic coating, said coating comprising an infrared light absorbing agent and a developer soluble polymer, which comprises a phenolic monomeric unit wherein the phenyl group of the phenolic monomeric unit is substituted by a group Q, wherein Q has the structure of formula 1, (formula 1)

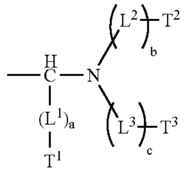

and is covalently linked to a carbon atom of the phenyl group and wherein $L^1$, $L^2$ and $L^3$ represent each a linking group, wherein a, b and c are each independently 0 or 1, and wherein $T^1$, $T^2$ and $T^3$ represent each a terminal group, with the proviso that the polymer is not represented by the following structure

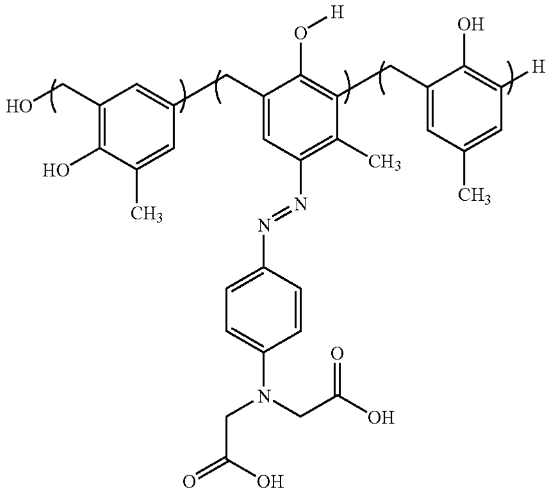

It is also an aspect of the present invention that the oleophilic coating comprising this polymer has an increased chemical resistance due to the modification of the polymer by this specified substituting group Q of formula 1. This chemical resistance can be measured by several tests.

In a preferred embodiment of the present invention, the group Q has the structure of formula 1, wherein $L^1$, $L^2$ and $L^3$ represent each a linking group, each group independently selected from alkylene such as methylene, ethylene, propylene or butylene, arylene such as phenylene or naphtalene, heteroarylene such as pyridyl, pyrazyl, pyrimidyl or thiazolyl, or wherein $L^2$ and $L^3$ together represent the necessary atoms to form a cyclic structure, wherein $T^1$, $T^2$ and $T^3$ represent a terminal group, each group independently selected from hydrogen or optionally substituted alkyl, alkenyl, alkynyl, cycloalkyl, heterocyclic, aryl, heteroaryl, aralkyl or heteroaralkyl group, with the exception that, when c is 0, $T^3$ is not hydrogen, or wherein $T^2$ and $T^3$ together represent the necessary atoms to form a cyclic structure, optionally annelated with another cyclic structure, and wherein a, b and c are 0 or 1.

The alkyl, alkenyl, alkynyl, cycloalkyl, heterocyclic, aryl, heteroaryl, aralkyl or heteroaralkyl group may be substituted by a substituting group selected from —$OR^1$, —$SR^1$, —CO—$OR^1$, —O—CO—$R^1$, —CO—$R^2$, —$SO_3$—$R^1$, —$SO_2$—$R^1$, —CN, —$NO_2$, halogen, phosphate group, phosphonate group, t-amine group, amide group, imide group, sulphonamide group wherein $R^1$ and $R^2$ are independently selected from hydrogen or an alkyl, alkenyl, alkynyl, cycloalkyl, heterocyclic, aryl, heteroaryl, aralkyl or heteroaralkyl group, with the exception that $R^2$ is not hydrogen.

Annelated means that two cyclic structures have two vicinal carbon atoms in common.

In a more preferred embodiment of the present invention, a is 0 and $T^1$ is hydrogen.

In another more preferred embodiment of the present invention, $T^2$ and/or $T^3$ comprise a 5- or 6-membered heteroaromatic group. This 5- or 6-membered heteroaromatic group contains most preferably a nitrogen atom. This 5- or 6-membered heteroaromatic group may also be substituted by another group such as alkyl, alkenyl, aryl, alkoxy, aryloxy, hydroxy, carboxylic acid or ester, sulphonic acid or ester, nitrile, nitro, halogen.

In accordance with another embodiment of the present invention, the developer soluble polymer, which comprises a phenolic monomeric unit wherein the phenyl group is substituted by the group Q, is prepared by a reaction of a phenolic monomeric unit with a first compound, comprising an aldehyde group, and a second compound, comprising an amine group. In a prefered embodiment, the first compound is formaldehyde, propionaldehyde or benzaldehyde; formaldehyde is most preferred. In another preferred embodiment, the second compound comprises a primary or secondary amine group.

The developer soluble polymer of the present invention can be obtained via several routes. In a preferred route, a polymer containing a phenolic monomeric unit is reacted with the first and second compound. In another route, a phenolic monomer is first reacted with the first and second compound and this modified monomer is subsequently polymerized or polycondensated with other monomers.

The reaction of the phenolic group with the first compound, comprising an aldehyde group, represented by $G^1$-CHO, and with the second compound, comprising an amine group, represented by $HNG^2G^3$, produces a coupling of an alkyleneamino group onto the aromatic ring structure, preferably on the ortho or para position of the phenolic hydroxy group. The reaction is schematically represented as shown in the following general scheme:

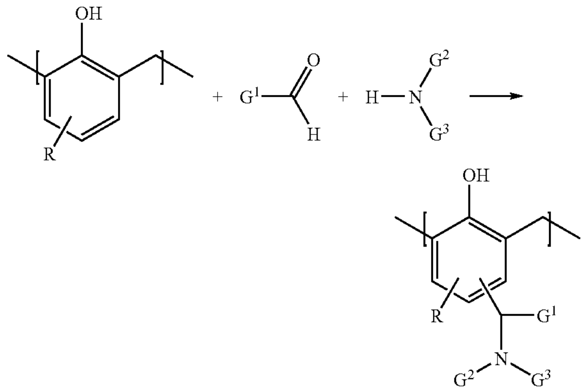

wherein R represents a hydrogen atom or a substituent such as an alkyl group and wherein $G^1$, $G^2$ and $G^3$ represent a substituent in correspondance with the structures represented by formula 1. This reaction, known in the literature as the Mannich-reaction, is preferentially carried out as described in "Advanced Organic Chemistry", by J. March, Second Edition, McGraw-Hill, 1977 and the cited references of this document.

Examples of the first compound, comprising an aldehyde group, which can be used together with an amine in the reaction with a phenolic group, are the following compounds:

AL-01: formaldehyde

AL-02: propionaldehyde

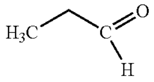

AL-03

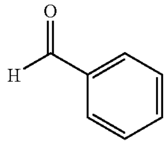

AL-04

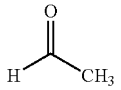

AL-05

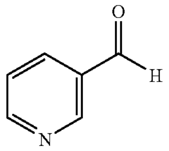

AL-06

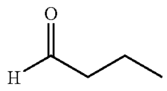

AL-07

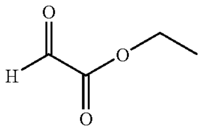

AL-08

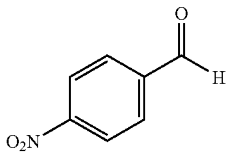

AL-09

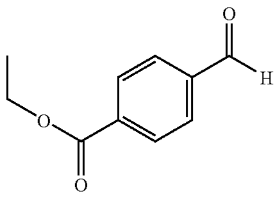

AL-10

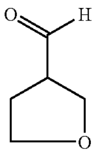

-continued

AL-11

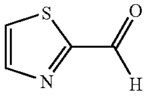

AL-12

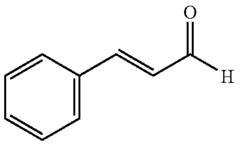

AL-13

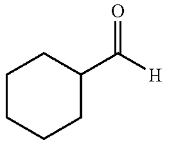

AL-14

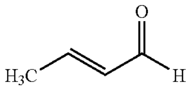

AL-15

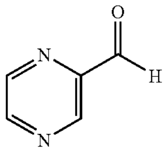

AL-16

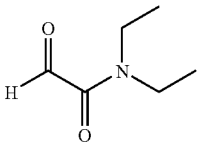

AL-17

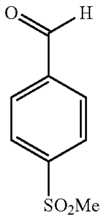

AL-18

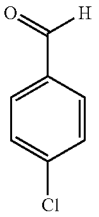

AL-19

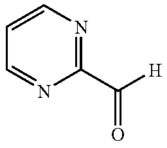

AL-20

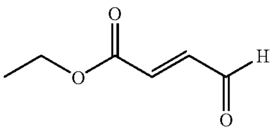

Examples of the second compound, comprising an amine group, which can be used together with an aldehyde in the reaction with a phenolic group, are the following compounds:
AM-01
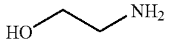
AM-02
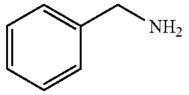
AM-03
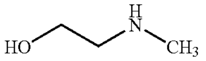
AM-04
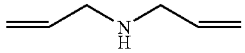
AM-05
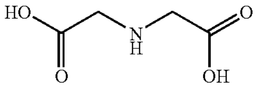
AM-06
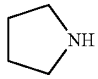
AM-07
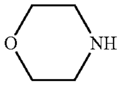
AM-08
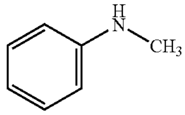
AM-09
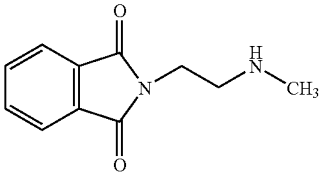
AM-10
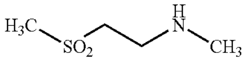
AM-11
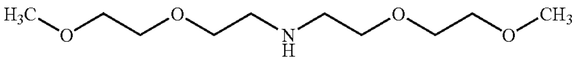
AM-13
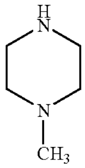
AM-13
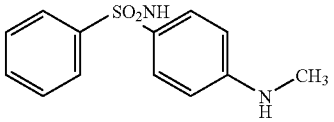
AM-14
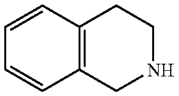
-continued
AM-15
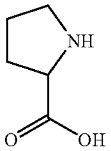
AM-16
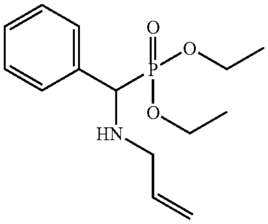
AM-17
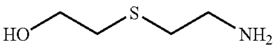
AM-18
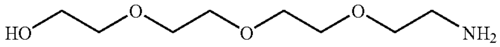
AM-19
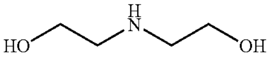
AM-20
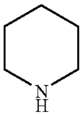
AM-21
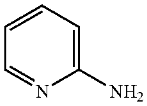
AM-22
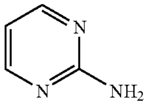
AM-23
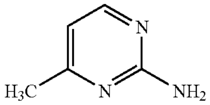
AM-24
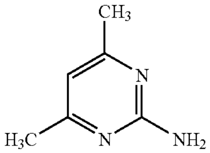
AM-25
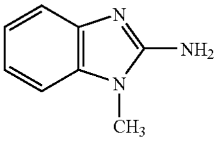
AM-26
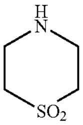

-continued

AM-27

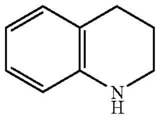

Polymers containing phenolic monomeric units can be a random, an alternating, a block or graft copolymer of different monomers and may be selected from e.g. polymers or copolymers of vinylphenol, novolac resins or resol resins. A novolac resin is preferred.

The novolac resin or resol resin may be prepared by polycondensation of at least one member selected from aromatic hydrocarbons such as phenol, o-cresol, p-cresol, m-cresol, 2,5-xylenol, 3,5-xylenol, resorcinol, pyrogallol, bisphenol, bisphenol A, trisphenol, o-ethylphenol, p-etylphenol, propylphenol, n-butylphenol, t-butylphenol, 1-naphtol and 2-naphtol, with at least one aldehyde or ketone selected from aldehydes such as formaldehyde, glyoxal, acetoaldehyde, propionaldehyde, benzaldehyde and furfural and ketones such as acetone, methyl ethyl ketone and methyl isobutyl ketone, in the presence of an acid catalyst. Instead of formaldehyde and acetaldehyde, paraformaldehyde and paraldehyde may, respectively, be used.

The weight average molecular weight, measured by gel permeation chromatography using universal calibration and polystyrene standards, of the novolac resin is preferably from 500 to 150,000 g/mol, more preferably from 1,500 to 15,000 g/mol.

The poly(vinylphenol) resin may also be a polymer of one or more hydroxy-phenyl containing monomers such as hydroxystyrenes or hydroxy-phenyl (meth)acrylates. Examples of such hydroxystyrenes are o-hydroxystyrene, m-hydroxystyrene, p-hydroxystyrene, 2-(o-hydroxyphenyl) propylene, 2-(m-hydroxyphenyl)propylene and 2-(p-hydroxyphenyl)propylene. Such a hydroxystyrene may have a substituent such as chlorine, bromine, iodine, fluorine or a $C_{1-4}$ alkyl group, on its aromatic ring. An example of such hydroxy-phenyl (meth)acrylate is 2-hydroxy-phenyl methacrylate.

The poly(vinylphenol) resin may usually be prepared by polymerizing one or more hydroxy-phenyl containing monomer in the presence of a radical initiator or a cationic polymerization initiator. The poly(vinylphenol) resin may also be prepared by copolymerizing one or more of these hydroxyphenyl containing monomers with other monomeric compounds such as acrylate monomers, methacrylate monomers, acrylamide monomers, methacrylamide monomers, vinyl monomers, aromatic vinyl monomers or diene monomers.

The weight average molecular weight, measured by gel permeation chromatography using universal calibration and polystyrene standards, of the poly(vinylphenol) resin is preferably from 1.000 to 200,000 g/mol, more preferably from 1,500 to 50,000 g/mol.

Examples of polymers containing phenolic monomeric units which can be modified are:

| | |
|---|---|
| POL-01: | ALNOVOL SPN452 is a solution of a novolac resin, 40% by weight in Dowanol PM, obtained from CLARIANT GmbH. Dowanol PM consists of 1-methoxy-2-propanol (>99.5%) and 2-methoxy-1-propanol (<0.5%). |

-continued

| | |
|---|---|
| POL-02: | ALNOVOL SPN400 is a solution of a novolac resin, 44% by weight in Dowanol PMA, obtained from CLARIANT GmbH. Dowanol PMA consists of 2-methoxy-1-methyl-ethylacetate. |
| POL-03: | ALNOVOL HPN100 a novolac resin obtained from CLARIANT GmbH. |
| POL-04: | DURITE PD443 is a novolac resin obtained from BORDEN CHEM. INC. |
| POL-05: | DURITE SD423A is a novolac resin obtained from BORDEN CHEM. INC. |
| POL-06: | DURITE SD126A is a novolac resin obtained from BORDEN CHEM. INC. |
| POL-07: | BAKELITE 6866LB02 is a novolac resin obtained from BAKELITE AG. |
| POL-08: | BAKELITE 6866LB03 is a novolac resin obtained from BAKELITE AG. |
| POL-09: | KR 400/8 is a novolac resin obtained from KOYO CHEMICALS INC. |
| POL-10: | HRJ 1085 is a novolac resin obtained from SCHNECTADY INTERNATIONAL INC. |
| POL-11: | HRJ 2606 is a phenol novolac resin obtained from SCHNECTADY INTERNATIONAL INC. |
| POL-12: | LYNCUR CMM is a copolymer of 4-hydroxy-styrene and methyl methacrylate obtained from SIBER HEGNER. |

The polymer of the present invention may contain more than one type of a substituting group Q. In this situation each type of the Q groups can be incorporated successively or a mixture of different first compounds, comprising an aldehyde, and second compounds, comprising an amine, can be reacted onto the polymer. The amount of each type of Q group incorporated in the polymer is limited by its solubility in the developer and may be comprised between 0.5 mol % and 50 mol %, more preferably between 1 mol % and 40 mol %, most preferably 2 mol % and 30 mol %.

Also other polymers, such as unmodified phenolic resins, can be added to the coating composition. Examples of such polymers are one of the polymers POL-01 to POL-12.

The polymer of the present invention are preferably added to the coating in a concentration range of 5% by weight to 98% by weight of the total coating, more preferably between 10% by weight to 95% by weight.

If the heat-sensitive coating is composed of more than one layer, the polymer of the present invention is present in at least one of these layers, e.g. in a top-layer. The polymer can also be present in more than one layer of the coating, e.g. in a top-layer and in an intermediate layer.

The support has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel.

A particularly preferred lithographic support is an electrochemically grained and anodized aluminum support.

Graining and anodizing of aluminum lithographic supports is well known. The grained aluminum support used in the material of the present invention is preferably an electrochemically grained support. The acid used for graining can be e.g. nitric acid. The acid used for graining preferably comprises hydrogen chloride. Also mixtures of e.g. hydrogen chloride and acetic acid can be used.

The grained and anodized aluminum support may be post-treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with an organic acid and/or salt thereof, e.g. carboxylic acids, hydroxycarboxylic acids, sulfonic acids or phosphonic acids, or their salts, e.g. succinates, phosphates, phosphonates, sulfates, and sulfonates. A citric acid or citrate solution is preferred. This treatment may be carried out at room temperature or may be carried out at a slightly elevated temperature of about 30 to 50° C. A further post-treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. It is further evident that one or more of these post-treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment, the support can also be a flexible support, which is provided with a hydrophilic layer, hereinafter called 'base layer'. The flexible support is e.g. paper, plastic film, thin aluminum or a laminate thereof. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm.

The hydrophilic binder for use in the base layer is e.g. a hydrophilic (co)polymer such as homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight.

The amount of hardening agent, in particular tetraalkyl orthosilicate, is preferably at least 0.2 parts per part by weight of hydrophilic binder, more preferably between 0.5 and 5 parts by weight, most preferably between 1 parts and 3 parts by weight.

The hydrophilic base layer may also contain substances that increase the mechanical strength and the porosity of the layer. For this purpose colloidal silica may be used. The colloidal silica employed may be in the form of any commercially available water dispersion of colloidal silica for example having an average particle size up to 40 nm, e.g. 20 nm. In addition inert particles of larger size than the colloidal silica may be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the hydrophilic base layer is given a uniform rough texture consisting of microscopic hills and valleys, which serve as storage places for water in background areas.

Particular examples of suitable hydrophilic base layers for use in accordance with the present invention are disclosed in EP-A-601 240, GB-P-1 419 512, FR-P-2 300 354, U.S. Pat. No. 3,971,660, and U.S. Pat. No. 4,284,705.

It is particularly preferred to use a film support to which an adhesion improving layer, also called support layer, has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 $mg/m^2$ and 750 $mg/m^2$. Further, the ratio of silica to hydrophilic binder is preferably more than 1 and the surface area of the colloidal silica is preferably at least 300 $m^2$/gram, more preferably at least 500 $m^2$/gram.

The coating provided on the support is heat-sensitive and can preferably be handled in normal working lighting conditions (daylight, fluorescent light) for several hours. The coating preferably does not contain UV-sensitive compounds which have an absorption maximum in the wavelength range of 200 nm to 400 nm such as diazo compounds, photoacids, photoinitiators, quinone diazides, or sensitizers. Preferably the coating neither contains compounds which have an absorption maximum in the blue and green visible light wavelength range between 400 and 600 nm.

According to one embodiment, the printing plate precursor is positive-working, i.e. after exposure and development the exposed areas of the oleophilic layer are removed from the support and define hydrophilic, non-image (non-printing) areas, whereas the unexposed layer is not removed from the support and defines an oleophilic image (printing) area. According to another embodiment, the printing plate precursor is negative-working, i.e. the image areas correspond to the exposed areas.

The coating may comprise one or more distinct layers. Besides the layers discussed hereafter, the coating may further comprise e.g. a "subbing" layer which improves the adhesion of the coating to the support, a covering layer which protects the coating against contamination or mechanical damage, and/or a light-to-heat conversion layer which comprises an infrared light absorbing compound.

A suitable negative-working alkaline developing printing plate comprises a phenolic resin and a latent Brönsted acid which produces acid upon heating or IR radiation. These acids catalyze crosslinking of the coating in a post-exposure heating step and thus hardening of the exposed regions. Accordingly, the non-exposed regions can be washed away by a developer to reveal the hydrophilic substrate underneath. For a more detailed description of such a negative-working printing plate precursor we refer to U.S. Pat. No. 6,255,042 and U.S. Pat. No. 6,063,544 and to references cited in these documents. In such a negative-working lithographic printing plate precursor, the polymer of the present invention is added to the coating composition and replaces at least part of the phenolic resin.

In a positive-working lithographic printing plate precursor, the coating is capable of heat-induced solubilization, i.e. the coating is resistant to the developer and ink-accepting in the non-exposed state and becomes soluble in the developer upon exposure to heat or infrared light to such an extent that the hydrophilic surface of the support is revealed thereby.

Besides the polymer of the present invention, the coating may contain additional polymeric binders that are soluble in an aqueous alkaline developer. Preferred polymers are phenolic resins, e.g. novolac, resoles, polyvinyl phenols and carboxy-substituted polymers. Typical examples of such polymers are described in DE-A-4007428, DE-A-4027301 and DE-A-4445820.

In a preferred positive-working lithographic printing plate precursor, the coating also contains one or more dissolution inhibitors. Dissolution inhibitors are compounds which reduce the dissolution rate of the hydrophobic polymer in the aqueous alkaline developer at the non-exposed areas of the coating and wherein this reduction of the dissolution rate is destroyed by the heat generated during the exposure so that the coating readily dissolves in the developer at exposed areas. The dissolution inhibitor exhibits a substantial latitude in dissolution rate between the exposed and non-exposed areas. By preference, the dissolution inhibitor has a good dissolution rate latitude when the exposed coating areas have dissolved completely in the developer before the non-exposed areas are attacked by the developer to such an extent that the ink-accepting capability of the coating is affected. The dissolution inhibitor(s) can be added to the layer which comprises the hydrophobic polymer discussed above.

The dissolution rate of the non-exposed coating in the developer is preferably reduced by interaction between the hydrophobic polymer and the inhibitor, due to e.g. hydrogen bonding between these compounds. Suitable dissolution inhibitors are preferably organic compounds which comprise at least one aromatic group and a hydrogen bonding site, e.g. a carbonyl group, a sulfonyl group, or a nitrogen atom which may be quaternized and which may be part of a heterocyclic ring or which may be part of an amino substituent of said organic compound. Suitable dissolution inhibitors of this type have been disclosed in e.g. EP-A 825927 and 823327.

Water-repellent polymers represent an another type of suitable dissolution inhibitors. Such polymers seem to increase the developer resistance of the coating by repelling the aqueous developer from is the coating. The water-repellent polymers can be added to the layer comprising the hydrophobic polymer and/or can be present in a separate layer provided on top of the layer with the hydrophobic polymer. In the latter embodiment, the water-repellent polymer forms a barrier layer which shields the coating from the developer and the solubility of the barrier layer in the developer or the penetrability of the barrier layer by the developer can be increased by exposure to heat or infrared light, as described in e.g. EP-A 864420, EP-A 950517 and WO99/21725. Preferred examples of the water-repellent polymers are polymers comprising siloxane and/or perfluoroalkyl units. In one embodiment, the coating contains such a water-repellent polymer in an amount between 0.5 and 25 $mg/m^2$, preferably between 0.5 and 15 $mg/m^2$ and most preferably between 0.5 and 10 $mg/m^2$. When the water-repellent polymer is also ink-repelling, e.g. in the case of polysiloxanes, higher amounts than 25 $mg/m^2$ can result in poor ink-acceptance of the non-exposed areas. An amount lower than 0.5 $mg/m^2$ on the other hand may lead to an unsatisfactory development resistance. The polysiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the (co)polymer is at least 2, preferably at least 10, more preferably at least 20. It may be less than 100, preferably less than 60. In another embodiment, the water-repellent polymer is a block-copolymer or a graft-copolymer of a poly (alkylene oxide) block and a block of a polymer comprising siloxane and/or perfluoroalkyl units. A suitable copolymer comprises about 15 to 25 siloxane units and 50 to 70 alkylene oxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. Such a copolymer acts as a surfactant which upon coating, due to its bifunctional structure, automatically positions itself at the interface between the coating and air and thereby forms a separate top layer even when the whole coating is applied from a single coating solution. Simultaneously, such surfactants act as a spreading agent which improves the coating quality. Alternatively, the water-repellent polymer can be applied in a second solution, coated on top of the layer comprising the hydrophobic polymer. In that embodiment, it may be advantageous to use a solvent in the second coating solution that is not capable of dissolving the ingredients present in the first layer so that a highly concentrated water-repellent phase is obtained at the top of the coating.

Preferably, also one or more development accelerators are included in the coating, i.e. compounds which act as dissolution promoters because they are capable of increasing the dissolution rate of the non-exposed coating in the developer. The simultaneous application of dissolution inhibitors and accelerators allows a precise fine tuning of the dissolution behavior of the coating. Suitable dissolution accelerators are cyclic acid anhydrides, phenols or organic acids. Examples of the cyclic acid anhydride include phthalic anhydride, tetrahydrophthalic anhydride, hexahydrophthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3",4"-tetrahydroxy-3,5,3',5'-tetramethyltriphenyl-methane, and the like. Examples of the organic acids include sulfonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight, relative to the coating as a whole.

The polymer which contains a phenolic monomeric unit modified as described in the present invention, can be used in conventional photosensitive printing plate precursors wherein at least part of the conventional phenolic polymer is replaced by at least one of the polymers modified as described in the present invention.

According to a more preferred embodiment, the material of the present invention is image-wise exposed to infrared light, which is converted into heat by an infrared light absorbing agent, which may be a dye or pigment having an absorption maximum in the infrared wavelength range. The concentration of the sensitizing dye or pigment in the coating is typically between 0.25 and 10.0 wt. %, more preferably between 0.5 and 7.5 wt. % relative to the coating as a whole. Preferred IR-absorbing compounds are dyes such as cyanine or merocyanine dyes or pigments such as carbon black. A suitable compound is the following infrared dye:

IR-1

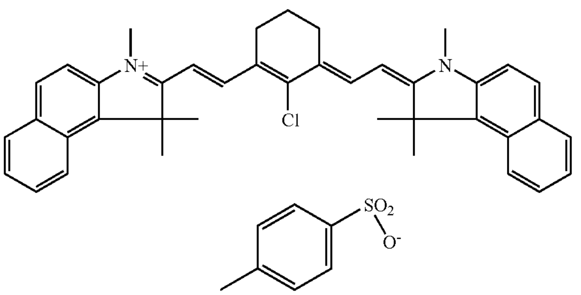

The coating may further contain an organic dye which absorbs visible light so that a perceptible image is obtained upon image-wise exposure and subsequent development. Such a dye is often called contrast dye or indicator dye. Preferably, the dye has a blue color and an absorption maximum in the wavelength range between 600 nm and 750 nm. Although the dye absorbs visible light, it preferably does not sensitize the printing plate precursor, i.e. the coating does not become more soluble in the developer upon exposure to visible light. Suitable examples of such a contrast dye are the quaternized triarylmethane dyes. Another suitable compound is the following dye:

CD-1

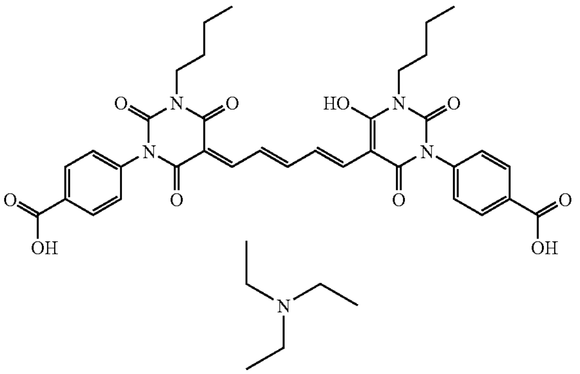

The infrared light absorbing compound and the contrast dye may be present in the layer comprising the hydrophobic polymer, and/or in the barrier layer discussed above and/or in an optional other layer. According to a highly preferred embodiment, the infrared light absorbing compound is concentrated in or near the barrier layer, e.g. in an intermediate layer between the layer comprising the hydrophobic polymer and the barrier layer.

The printing plate precursor of the present invention can be exposed to infrared light with LEDs or a laser. Preferably, a laser emitting near infrared light having a wavelength in the range from about 750 to about 1500 nm is used, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 μm), the scan speed and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) plate-setters. ITD plate-setters for thermal plates are typically characterized by a very high scan speed up to 1500 m/sec and may require a laser power of several Watts. The Agfa Galileo T is a typical example of a plate-setter using the ITD-technology. XTD plate-setters operate at a lower scan speed typically from 0.1 m/sec to 10 m/sec and have a typical laser-output-power per beam from 20 mW up to 500 mW. The Creo Trendsetter plate-setter family and the Agfa Excalibur plate-setter family both make use of the XTD-technology.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

In the development step, the non-image areas of the coating can be removed by immersion in an aqueous alkaline developer, which may be combined with mechanical rubbing, e.g. by a rotating brush. The developer preferably has a pH above 10, more preferably above 12. The development step may be followed by a rinsing step, a gumming step, a drying step and/or a post-baking step.

The printing plate thus obtained can be used for conventional, so-called wet offset printing, in which ink and an aqueous dampening liquid is supplied to the plate. Another suitable printing method uses so-called single-fluid ink without a dampening liquid. Single-fluid ink consists of an ink phase, also called the hydrophobic or oleophilic phase, and a polar phase which replaces the aqueous dampening liquid that is used in conventional wet offset printing. Suitable examples of single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase and a polyol phase as described-in WO 00/32705.

EXAMPLES

Preparation of Polymer MP-01

A mixture of 76.5 g of POL-01 solution (40% by weight in Dowanol PM) was diluted with 100 ml Dowanol PM and 10 ml water and brought to 30° C. To this mixture was first added 4.275 g AM-01 (0.07 mol) over a period of 15 minutes and then 6 g of a solution of 35% by weight of Al-01 (0.07 mol) in water over a period of 30 minutes. During the addition the temperature rose to 35° C. The mixture was subsequently heated to 65° C. at which temperature it was stirred for 3 hours.

The mixture was then cooled to 30° C. and poored into 1.5 liters of water over a period of 30 minutes while continously stirring. Then, 100 ml acetic acid was added and the mixture was stirred for 2 hours. The precipitated polymer was finally isolated by filtration, washed with water and dried at 45° C.

Preparation of Polymer MP-02

The preparation of polymer MP-02 was carried out in the same way as that of polymer MP-01 with the exception that 7.5 g of AM-02 was used instead of AM-01.

Preparation of Polymer MP-03

The preparation of polymer MP-03 was carried out in the same way as that of polymer MP-01 with the exception that 5.25 g of AM-03 was used instead of AM-01.

Preparation of Polymer MP-04

The preparation of polymer MP-04 was carried out in the same way as that of polymer MP-01 with the exception that 5.25 g of AM-03 was used instead of AM-01 and 4.06 g of AL-02 (0.07 mol) was used instead of 6 g of the solution of 35% by weight of AL-01.

Preparation of Polymer MP-05

The preparation of polymer MP-05 was carried out in the same way as that of polymer MP-01 with the exception that 6.8 g of AM-04 was used instead of AM-01.

Preparation of Polymer MP-06

The preparation of polymer MP-06 was carried out in the same way as that of polymer MP-01 with the exception that 9.3 g of AM-05 was used instead of AM-01.

Preparation of Polymer MP-07

The preparation of polymer MP-07 was carried out in the same way as that of polymer MP-01 with the exception that 4.98 g of AM-06 was used instead of AM-01.

Preparation of Polymer MP-08

The preparation of polymer MP-08 was carried out in the same way as that of polymer MP-01 with the exception that 76.5 g of POL-08 solution (40% by weight in Dowanol PM) was used instead of POL-01 and that 4.98 g of AM-06 was used instead of AM-01.

Preparation of Polymer MP-09

The preparation of polymer MP-09 was carried out in the same way as that of polymer MP-01 with the exception that 6.1 g of AM-07 was used instead of AM-01.

Test 1

Preparation of the Coating:

A coating solution was prepared by mixing the following ingredients:

- 206.07 g Tetrahydrofuran
- 54.26 g of a solution of a phenolic polymer, as listed in table 1, in a concentration of 40% by weight in Dowanol PM
- 371.03 g Dowanol PM
- 262.09 g methyl ethyl ketone
- 1.96 g of the infrared dye IR-1
- 69.91 g of a solution of the Basonyl Blau 640 in a concentration of 1% by weight in Dowanol PM; Basonyl Blue 640 is a quaternary triarylmethane dye, commercially available of BASF
- 27.97 g of a solution of Tego Glide 410 in a concentration of 1% by weight in Dowanol PM; TegoGlide 410 is a copolymer of polysiloxane and poly(alkylene oxide), commercially available of Tego Chemie Service GmbH
- 6.71 g of 3,4,5-trimethoxycinnamic acid.

The coating solution was coated on an electrochemically grained and anodized aluminum substrate at a wet thickness of 20 μm. The coating was dried for 3 minute at 130° C.

For measuring the chemical resistance 3 different solutions were selected:

- Test solution 1: solution of isopropanol in a concentration of 50% by weight in water,
- Test solution 2: isopropanol,
- Test solution 3: EMERALD PREMIUM MXEH, commercially available from ANCHOR.

The chemical resistance was tested by contacting a droplet of 40 μl of a test solution on different spots of the coating. After 3 minutes, the droplet was removed from the coating with a cotton pad. The attack on the coating due to each test solution was rated by visual inspection as follows:

- 0: no attack,
- 1: changed gloss of the coating's surface,
- 2: small attack of the coating (thickness is decreased),
- 3: heavy attack of the coating,
- 4: completely dissolved coating.

The higher the rating, the less is the chemical resistance of the coating. The results for the test solutions on each coating are summarized in Table 1. Table 1 also contains information about the type of the phenolic polymer used in the modification reaction, the type of modification reagentia, the degree of modification (in mol %) and the MP-number of the prepared polymer.

TABLE 1

| Example number | Type Polymer | Type reagens (aldehyde/ amine) | Degree modif. (mol %) | Prep. Polym. MP-nr. | TEST 1 Test solution 1 | TEST 1 Test solution 2 | TEST 1 Test solution 3 |
|---|---|---|---|---|---|---|---|
| Comparative example 1 | POL-01 | — | — | — | 4 | 4 | 4 |
| Comparative example 2 | POL-08 | — | — | — | 4 | 4 | 4 |
| Example 1 | POL-01 | AL-01/ AM-01 | 25 | MP-01 | 0 | 1 | 1 |
| Example 2 | POL-01 | AL-01/ AM-02 | 25 | MP-02 | 1 | 2 | 0 |
| Example 3 | POL-01 | AL-01/ AM-03 | 25 | MP-03 | 1 | 2 | 1 |
| Example 4 | POL-01 | AL-02/ AM-03 | 25 | MP-04 | 2 | 3 | 2 |
| Example 5 | POL-01 | AL-01/ AM-04 | 25 | MP-05 | 0 | 3 | 0 |
| Example 6 | POL-01 | AL-01/ AM-05 | 25 | MP-06 | 2 | 3 | 2 |
| Example 7 | POL-01 | AL-01/ AM-06 | 25 | MP-07 | 1 | 2 | 0 |
| Example 8 | POL-08 | AL-01/ AM-06 | 25 | MP-08 | 0 | 1 | 3 |

TABLE 1-continued

| Example number | Type Polymer | Type reagens (aldehyde/ amine) | Degree modif. (mol %) | Prep. Polym. MP-nr. | TEST 1 Test solution 1 | TEST 1 Test solution 2 | TEST 1 Test solution 3 |
|---|---|---|---|---|---|---|---|
| Example 9 | POL-01 | AL-01/ AM-07 | 25 | MP-09 | 1 | 2 | 0 |

The Examples in Table 1 demonstrate that these polymers, modified according to the present invention, give rise to a significant increase of the chemical resistance of the coating compared with the unmodified polymer.

Example 4 demonstrates also an increased chemical resistance compared with the unmodified polymer, but the modification of polymer by AL-02 (i.e. propionaldehyde) and AM-03 is less favourable for the chemical resistance than the polymer modified by AL-01 (i.e. formaldehyde) and AM-03.

Test 2

Preparation of the Coating:

The Comparative Example 3 and the Invention Examples 10 to 18 were prepared in the same way as Comparative Example 1 and Invention Example 1 as described in Test 1.

The chemical resistance was measured in the same way as in Test 1 with the exception that Test solution 4 was used instead of Test solution 1, 2 or 3:

Test solution 4: ANCHOR WASH R-228 is a roller and blanket cleaner, commercially available from ANCHOR.

For the evaluation the same rating was used as in Test 1 and the results are summarized in Table 2.

TABLE 2

| Example number | Type Polymer | Type reagens (aldehyde/ amine) | Degree modif. (mol %) | Prep. Polym. MP-nr. | TEST 2 Test solution 4 |
|---|---|---|---|---|---|
| Comparative example 3 | POL-01 | — | — | — | 3 |
| Comparative example 4 | POL-08 | — | — | — | 3 |
| Example 10 | POL-01 | AL-01/ AM-01 | 25 | MP-01 | 2 |
| Example 11 | POL-01 | AL-01/ AM-02 | 25 | MP-02 | 1 |
| Example 12 | POL-01 | AL-01/ AM-03 | 25 | MP-03 | 2 |
| Example 13 | POL-01 | AL-02/ AM-03 | 25 | MP-04 | 2 |
| Example 14 | POL-01 | AL-01/ AM-04 | 25 | MP-05 | 2 |
| Example 15 | POL-01 | AL-01/ AM-05 | 25 | MP-06 | 0 |
| Example 16 | POL-01 | AL-01/ AM-06 | 25 | MP-07 | 1 |
| Example 17 | POL-08 | AL-01/ AM-06 | 25 | MP-08 | 0 |
| Example 18 | POL-01 | AL-01/ AM-07 | 25 | MP-09 | 2 |

The Examples in Table 2 demonstrate that these polymers, modified according to the present invention, give rise to a significant increase of the chemical resistance of the coating against a press s chemical compared with the unmodified polymer.

The invention claimed is:

1. A heat-sensitive lithographic printing plate precursor comprising a support having a hydrophilic surface and an oleophilic coating, provided on the hydrophilic surface, said coating comprising:

an infrared light absorbing agent, and a developer soluble polymer which comprises a phenolic monomeric unit wherein the phenyl group of the phenolic monomeric unit is substituted by a group Q, wherein Q has the structure of Formula 1

(Formula 1)

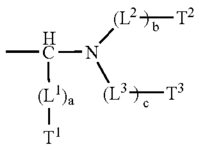

and is covalently linked to a carbon atom of the phenyl group, wherein $L^1$, $L^2$ and $L^3$ each represent a linking group, each group independently selected from alkylene, arylene, heteroarylene, or wherein $L^2$ and $L^3$ together represent the necessary atoms to form a cyclic structure, wherein a, b and c are 0 or 1, wherein $T^1$ represents a terminal group selected from hydrogen or optionally substituted alkyl, alkenyl, alkynyl, cycloalkyl, heterocyclic, aryl, heteroaryl, aralkyl or heteroaralkyl group, wherein, if substituted, said alkyl, alkenyl, alkynyl, cycloalkyl, heterocyclic, aryl, heteroaryl, aralkyl or heteroaralkyl group is substituted by a substituting group selected from —$OR^1$, —$SR^1$, —CO—$OR^1$, —O—CO—$R^1$, —CO—$R^2$, —$SO_3$—$R^1$, —$SO_2$—$R^1$, —CN, —$NO_2$, halogen, phosphate group, phosphonate group, t-amine group, amide group, imide group and sulphonamide group, wherein $R^1$ and $R^2$ are independently selected from hydrogen or an alkyl, alkenyl, alkynyl, cycloalkyl, heterocyclic, aryl, heteroaryl, aralkyl or heteroaralkyl group, with the exception that $R^2$ is not hydrogen, and wherein $T^2$ and $T^3$ comprise a 5- or 6-membered heteroaromatic group or wherein $T^2$ comprises a 5- or 6-membered heteroaromatic group and $T^3$ is one of the groups selected from $T^1$ or wherein $T^2$ and $T^3$ together represent the necessary atoms to form a cyclic structure, optionally annelated with another cyclic structure, with the proviso that the polymer is not represented by the following structure

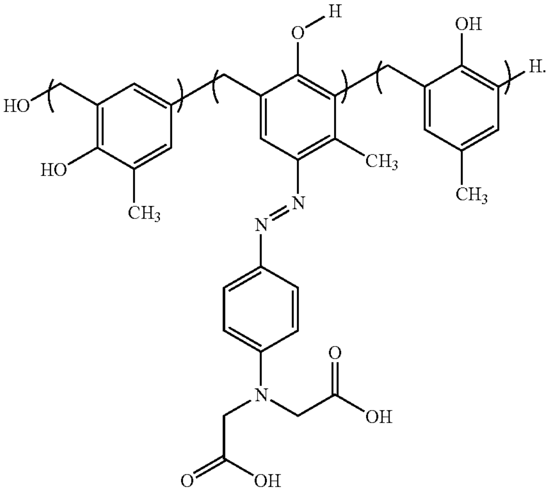

2. The lithographic printing plate precursor according to claim 1, wherein a is 0 and $T^1$ is hydrogen.

3. The lithographic printing plate precursor according to claim 2, wherein said polymer comprising a phenolic monomeric unit is a novolac, resol or polyvinylphenol.

4. The lithographic printing plate precursor according to claim 2, wherein said coating further comprises a dissolution inhibitor and wherein said precursor is a positive working lithographic printing plate precursor.

5. The lithographic printing plate precursor according to claim 2, wherein said coating further comprising a latent Brönsted acid and an acid-crosslinkable compound and wherein said precursor is a negative working lithographic printing plate precursor.

6. The lithographic printing plate precursor according to claim 1, wherein said polymer comprising a phenolic monomeric unit is a novolac, resol or polyvinylphenol.

7. The lithographic printing plate precursor according to claim 1, wherein said coating further comprises a dissolution inhibitor and wherein said precursor is a positive working lithographic printing plate precursor.

8. The lithographic printing plate precursor according to claim 1, wherein said coating further comprising a latent Brönsted acid and an acid-crosslinkable compound and wherein said precursor is a negative working lithographic printing plate precursor.

9. A heat-sensitive lithographic printing plate precursor comprising a support having a hydrophilic surface and an oleophilic coating, provided on the hydrophilic surface, said coating comprising:

an infrared light absorbing agent, and a developer soluble polymer which comprises a phenolic monomeric unit wherein the phenyl group of the phenolic monomeric unit is substituted by a group Q, wherein Q has the structure of Formula 1

(Formula 1)

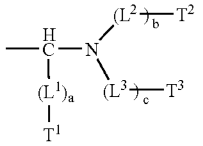

and is covalently linked to a carbon atom of the phenyl group, wherein $L^1$, $L^2$ and $L^3$ represent each a linking group, wherein a, b and c are each independently 0 or 1, wherein $T^1$, $T^2$ and $T^3$ each represent a terminal group, and wherein $T^2$ and/or $T^3$ comprise a 5- or 6-membered heteroaromatic group, with the proviso that the polymer is not represented by the following structure

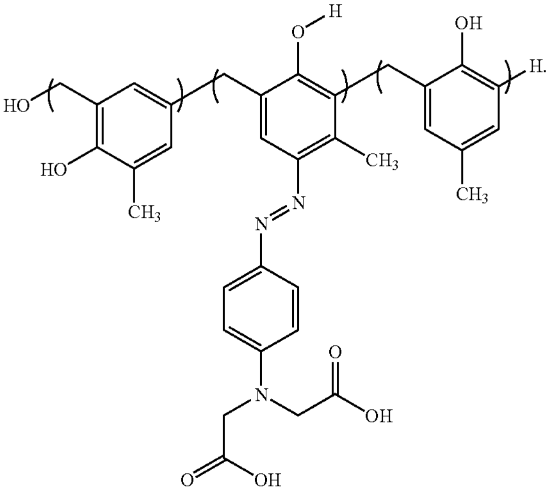

10. The lithographic printing plate precursor according to claim 9, wherein said coating further comprises a dissolution inhibitor and wherein said precursor is a positive working lithographic printing plate precursor.

* * * * *